(12) United States Patent
Brown et al.

(10) Patent No.: US 8,249,846 B2
(45) Date of Patent: Aug. 21, 2012

(54) AUTOMATED SIMULATION FABRIC DISCOVERY AND CONFIGURATION

(75) Inventors: Aaron Ches Brown, Austin, TX (US); Jeff Jerome Frankeny, Austin, TX (US); James Kai Hsu, Austin, TX (US); Glenn Owen Kincaid, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 12/402,650

(22) Filed: Mar. 12, 2009

(65) Prior Publication Data

US 2010/0235156 A1  Sep. 16, 2010

(51) Int. Cl.
*G06F 17/50* (2006.01)
(52) U.S. Cl. .......................................... 703/13; 370/254
(58) Field of Classification Search ............... 703/13, 703/21, 22, 24; 702/186; 709/221, 222; 370/254, 255, 395.53
See application file for complete search history.

(56) References Cited

U.S. PATENT DOCUMENTS

| | | | |
|---|---|---|---|
| 6,643,714 B1 * | 11/2003 | Chrysanthakopoulos ........ | 710/8 |
| 6,977,908 B2 * | 12/2005 | de Azevedo et al. .......... | 370/254 |
| 7,010,607 B1 | 3/2006 | Bunton ......................... | 709/228 |
| 7,020,697 B1 | 3/2006 | Goodman et al. ............ | 709/223 |
| 7,738,403 B2 * | 6/2010 | Ottamalika et al. .......... | 370/255 |
| 2003/0097438 A1 * | 5/2003 | Bearden et al. .............. | 709/224 |
| 2004/0025018 A1 | 2/2004 | Haas et al. .................... | 713/168 |
| 2005/0210454 A1 | 9/2005 | DeWitt, Jr. et al. .......... | 717/133 |
| 2005/0228531 A1 * | 10/2005 | Genovker et al. ............ | 700/130 |
| 2006/0239271 A1 | 10/2006 | Khasnabish et al. ..... | 370/395.21 |
| 2007/0223388 A1 | 9/2007 | Arad et al. ................... | 370/252 |
| 2007/0271082 A1 | 11/2007 | Dominguez et al. ............ | 703/20 |
| 2008/0080400 A1 * | 4/2008 | Kapoor et al. ................ | 370/255 |
| 2010/0235158 A1 | 9/2010 | Brown et al. .................. | 703/25 |

OTHER PUBLICATIONS

Antonio Robles-Gómez, "Implementing the Advanced Switching Fabric Discovery Process", Jan. 2007, IEEE.*
Herkersdorf et al., "Route Discovery for Multistage Fabrics in ATM switching Nodes" Performance Evaluation, vol. 22, Issue 3, May 1995, pp. 221-238.*
Barker et al.; "On the feasibility of Optical Circuit Switching for High Performance Computing Systems," IEEE/ACM Digital Library, 2005.
Eberle et al., "Separated High-bandwidth and Low-latency Communication in the Cluster Interconnect Clint," IEEE/ACM Digital Library, 2002.
Chaudhuri, M. et al., "SMTp: An Architecture for Next-Generation Scalable Multi-Threading," IEEE/ACM Digital Library, 2005.
Mukherjee, R. et al.; "Verification of an Industrial CC-NUMA Server," IEEE/ACM Digital Library, 2002.

(Continued)

*Primary Examiner* — Kamini S Shah
*Assistant Examiner* — Herng-Der Day
(74) *Attorney, Agent, or Firm* — VanLeeuwen & VanLeeuwen; Diana R. Gerhardt

(57) ABSTRACT

A configuration manager identifies a first device and a second device within a simulated system. Each device within the simulated system includes an inbound port and an outbound port. Next, the configuration manager injects a simulation only packet on the first device's outbound port and detects that the second device's inbound port receives the simulation only packet. As a result, the configuration manager determines that a direct connection exists between the first device's outbound port and the second device's inbound port. In turn, the configuration manager configures one or more first device configuration registers and one or more second device configuration registers that correspond to the first device and the second device, respectively.

20 Claims, 14 Drawing Sheets

OTHER PUBLICATIONS

Chapter 5, "Chapter 5, Network Layer," Oct. 26, 2004, http://homepages.ius.edu/rwisman/b438/html/chater5.htm.
Office Action for U.S. Appl. No. 12/402,588, mailed Aug. 26, 2011, 50 pages.
"Fine-Tuning Voice over Packet Services," Protocols.com, Jan. 4, 2009.

Final Office Action for U.S. Appl. No. 12/402,588 (Brown et al., "Automated System Latency Detection for Fabric Simulation," filed Mar. 12, 2009), US Patent and Trademark Office, mailed Mar. 28, 2012, 42 pages.

* cited by examiner

800

| Connection Table (Direct Connections) | | | | |
|---|---|---|---|---|
| Sending Port | Dest. Port | Traffic Type | Con. Width | Aggregate Bit |
| N0.D0.A | N1.D0.B | D | 4 | |
| N1.D0.B | N0.D0.A | D | 4 | |
| N0.D0.X | N0.D1.X | C/D | 8 | |
| N0.D1.X | N0.D0.X | C/D | 8 | |
| N1.D1.Z | N1.D0.Y | C | 4 | |
| N1.D0.Y | N1.D1.Z | C | 4 | |

| Connection Table (Direct Connections and Indirect Connections) | | | | | | | |
|---|---|---|---|---|---|---|---|
| Sending Port | Dest. Port | Hop 1 In | Hop 1 Out | Hop 1 Valid | Hop 2 In | Hop 2 Out | Hop 2 Valid |
| N0.D0.A | N1.D0.B | | | | | | |
| N1.D0.B | N0.D0.A | | | | | | |
| N0.D0.X | N0.D1.X | | | | | | |
| N0.D1.X | N0.D0.X | | | | | | |
| N1.D1.Z | N1.D0.Y | | | | | | |
| N1.D0.Y | N1.D1.Z | | | | | | |
| N0.D0.A | N1.D1.Z | N1.D0.B | N1.D0.Y | 1 | | | |
| N0.D1.X | N1.D1.Z | N0.D0.X | N0.D0.A | 1 | N1.D0.B | N1.D0.Y | 1 |

AUTOMATED SIMULATION FABRIC DISCOVERY AND CONFIGURATION

GOVERNMENT RIGHTS

This invention was made with United States Government support under Agreement No. HR0011-07-9-002 awarded by DARPA. The Government has certain rights in the invention.

BACKGROUND OF THE INVENTION

1. Technical Field

The present invention relates to injecting and detecting simulation only packets within a simulation environment during a connection discovery process in order to automatically program device interconnect configuration registers.

2. Description of the Related Art

A multi-chip Symmetric Multiprocessing (SMP) computer system utilizes an SMP device interconnect (fabric) bus to transfer commands and data between each device within the system. Each device includes a set of fabric configuration registers, which defines the manner in which the system's devices are interconnected.

When simulating an SMP system, a simulation program must accurately program all fabric configuration registers and maintain a database of all connections between devices in order to perform proper end-to-end tests. Each time that a system configuration changes, a developer modifies the simulation program to support the changes.

SUMMARY

A configuration manager identifies a first device and a second device within a simulated system. Each device within the simulated system includes an inbound port and an outbound port. Next, the configuration manager injects a simulation only packet on the first device's outbound port and detects that the second device's inbound port receives the simulation only packet. As a result, the configuration manager determines that a direct connection exists between the first device's outbound port and the second device's inbound port. In turn, the configuration manager configures one or more first device configuration registers and one or more second device configuration registers that correspond to the first device and the second device, respectively.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings, wherein:

FIG. 8A is an example of a connection table that a configuration manager populates during a direct connection discovery process;

FIG. 8B is an example of a connection table that includes indirect connection entries that a configuration manager enters;

DETAILED DESCRIPTION

Certain specific details are set forth in the following description and figures to provide a thorough understanding of various embodiments of the invention. Certain well-known details often associated with computing and software technology are not set forth in the following disclosure, however, to avoid unnecessarily obscuring the various embodiments of the invention. Further, those of ordinary skill in the relevant art will understand that they can practice other embodiments of the invention without one or more of the details described below. Finally, while various methods are described with reference to steps and sequences in the following disclosure, the description as such is for providing a clear implementation of embodiments of the invention, and the steps and sequences of steps should not be taken as required to practice this invention. Instead, the following is intended to provide a detailed description of an example of the invention and should not be taken to be limiting of the invention itself. Rather, any number of variations may fall within the scope of the invention, which is defined by the claims that follow the description.

The following detailed description will generally follow the summary of the invention, as set forth above, further explaining and expanding the definitions of the various aspects and embodiments of the invention as necessary. To this end, this detailed description first sets forth a computing environment in FIG. 1 that is suitable to implement the software and/or hardware techniques associated with the invention. A networked environment is illustrated in FIG. 2 as an extension of the basic computing environment, to emphasize that modern computing techniques can be performed across multiple discrete devices.

Figure 1:
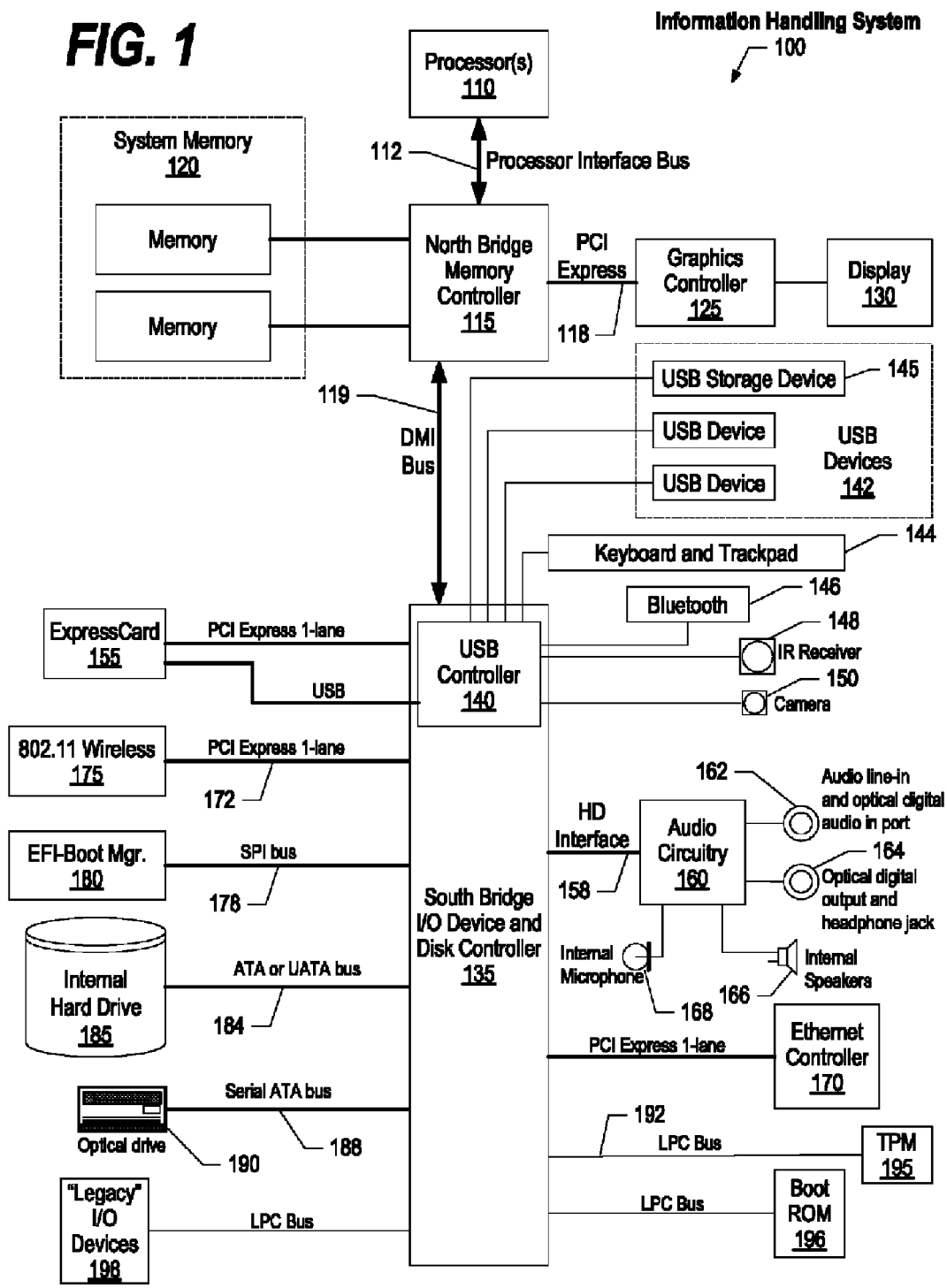
FIG. 1 is an exemplary block diagram of a data processing system in which the methods described herein can be implemented.
Figure 2:
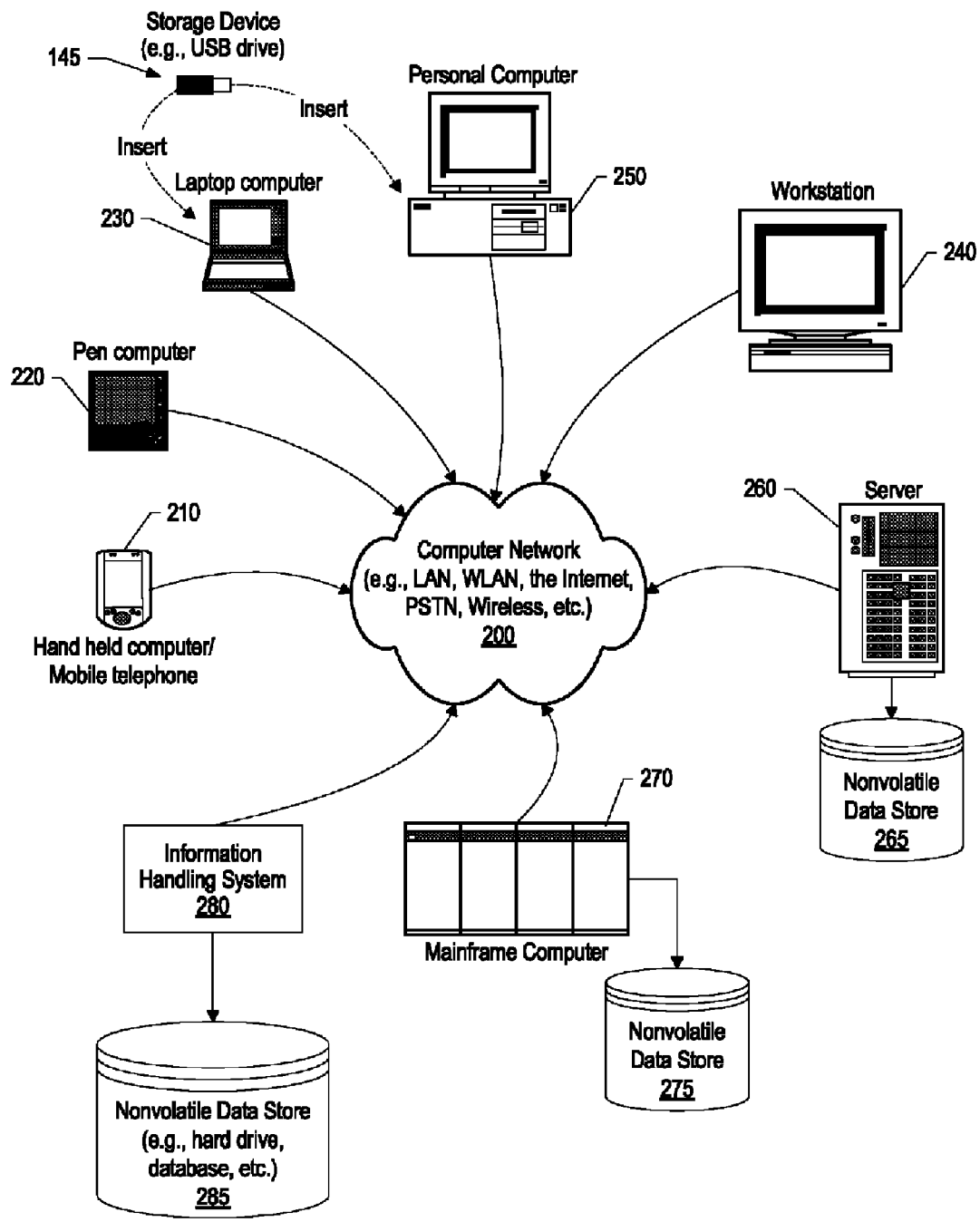
FIG. 2 provides an extension of the information handling system environment shown in FIG. 1 to illustrate that the methods described herein can be performed on a wide variety of information handling systems which operate in a networked environment.

FIG. 1 illustrates information handling system 100, which is a simplified example of a computer system capable of performing the computing operations described herein. Information handling system 100 includes one or more processors 110 coupled to processor interface bus 112. Processor interface bus 112 connects processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, PCI Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a Peripheral Component Interconnect (PCI) bus connects the Northbridge and the Southbridge. Southbridge 135, also known as the I/O Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. The LPC bus also connects Southbridge 135 to Trusted Platform Module (TPM) 195. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and USB connectivity as it connects to Southbridge 135 using both the Universal Serial Bus (USB) the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). USB Controller 140 also provides USB connectivity to other miscellaneous USB connected devices 142, such as a mouse, removable nonvolatile storage device 145, modems, network cards, ISDN connectors, fax, printers, USB hubs, and many other types of USB connected devices. While removable nonvolatile storage device 145 is shown as a USB-connected device, removable nonvolatile storage device 145 could be connected using a different interface, such as a Firewire interface, etcetera.

Wireless Local Area Network (LAN) device 175 connects to Southbridge 135 via the PCI or PCI Express bus 172. LAN device 175 typically implements one of the IEEE 0.802.11 standards of over-the-air modulation techniques that all use the same protocol to wireless communicate between information handling system 100 and another computer system or device. Optical storage device 190 connects to Southbridge 135 using Serial ATA (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks.

While FIG. 1 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 195) shown in FIG. 1 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 2.

FIG. 2 provides an extension of the information handling system environment shown in FIG. 1 to illustrate that the methods described herein can be performed on a wide variety of information handling systems that operate in a networked environment. Types of information handling systems range from small handheld devices, such as handheld computer/mobile telephone 210 to large mainframe systems, such as mainframe computer 270. Examples of handheld computer 210 include personal digital assistants (PDAs), personal entertainment devices, such as MP3 players, portable televisions, and compact disc players. Other examples of information handling systems include pen, or tablet, computer 220, laptop, or notebook, computer 230, workstation 240, personal computer system 250, and server 260. Other types of information handling systems that are not individually shown in FIG. 2 are represented by information handling system 280.

As shown, the various information handling systems can be networked together using computer network 200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 2 depicts separate nonvolatile data stores (server 260 utilizes nonvolatile data store 265, mainframe computer 270 utilizes nonvolatile data store 275, and information handling system 280 utilizes nonvolatile data store 285). The nonvolatile data store can be a component that is external to the various information handling systems or can be internal to one of the information handling systems. In addition, removable nonvolatile storage device 145 can be shared among two or more information handling systems using various techniques, such as connecting the removable nonvolatile storage device 145 to a USB port or other connector of the information handling systems.

Figure 3:
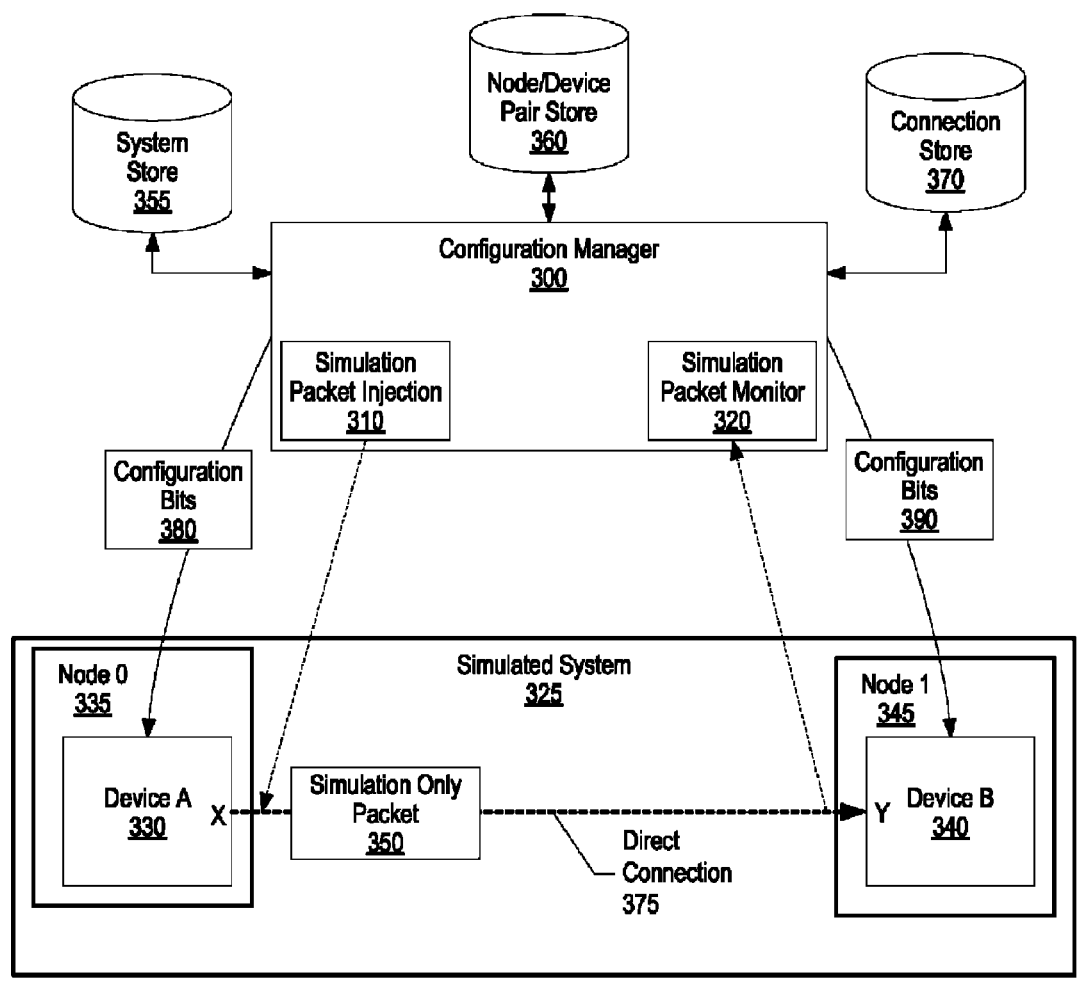
FIG. 3 is an exemplary diagram of a configuration manager injecting simulation only packets onto device outbound ports and monitoring device inbound ports in order to automatically detect device connections and program interconnect configuration registers within a simulation environment.

FIG. 3 is a diagram of a configuration manager injecting simulation only packets onto device outbound ports and monitoring device inbound ports in order to automatically detect device connections and automatically program interconnect configuration registers within a simulation environment. Configuration manager 300 commences direct connection discovery by retrieving system information from system store 355. The system information includes information pertaining to simulated system 325, such as a port's node identifier/device identifier/port identifier and the number of devices included in a system. System store 355 may be stored on a nonvolatile storage area, such as a computer hard drive.

Next, configuration manager 300 identifies each of simulated system 325's device inbound ports and outbound ports utilizing the system information. The example shown in FIG. 3 shows that simulated system 325 includes two devices, which are device A 330 and device B 340. Device A 330 includes port X and device B 340 includes port Y. As one skilled in the art can appreciate, device ports are typically unidirectional. Meaning, device A 330's port X includes an outbound driver and also includes an inbound receiver. FIG. 3 shows configuration manager 300 injecting simulation only packet 350 onto device A 330 port X's outbound port. Simulation only packet 350 includes information that identifies the particular injected port. Using the example shown in FIG. 3, simulation only packet 350 includes information that identifies node 0 335, device A 330, port X (see FIG. 7A and corresponding text for further details).

Configuration manager 300 monitors each of simulated system 325's device inbound ports in order to detect simulation only packet 350's destination. As can be seen, simulation only packet 350 travels to device B 340's port Y, which simulation only packet monitor 320 detects. Once detected, configuration manager 300 extracts sending port information from simulation only packet 350 (node ID/device ID/port ID), and enters a node/device pair in node/device pair store 360, which is node 0 335/device A 330. Configuration manager 300 utilizes the node/device pair information after the direct connection discovery process in order to ensure that each device is connected (directly or indirectly) to other devices (see FIGS. 12, 13, and corresponding text for further details). Node/device pair store 360 may be stored on a nonvolatile storage area, such as a computer hard drive.

In addition to storing node/device pair information, configuration manager 300 creates a connection entry in connection store 370 and includes sending port information (extracted from simulation only packet 350) and destination port information (identified by simulation only packet monitor 320). Using the example shown in FIG. 3, configuration manager 300 enters information for node 0 335/device A 330/port X (sending port) and enters information for node 1 345/device B 340/port Y (destination port) into the connection entry (see FIG. 8A and corresponding text for further details). Connection store 370 may be stored on a nonvolatile storage area, such as a computer hard drive.

Once configuration manager 300 completes the direct connection discovery process, configuration manager 300 identifies direct connections between devices utilizing the connection entries stored in connection store 370. As can be seen, configuration manager identifies direct connection 375 between device A 330 and device B 340 due to the fact that configuration manager 300 injected simulation only packet 350 on device A 330 port X and detected the packet on device B 340 port Y. Configuration manager 300 then configures device A 330's and device B 340's configuration registers via configuration bits 380 and 390, respectively. The configuration registers specify the connection between the two devices such that the devices understand a manner in which to send information to each other. In addition to identifying direct connections between devices, configuration manager 300 identifies indirect connections between devices that are not directly connected. Indirect connections are connections that commence at a starting device and travel through one or more devices before terminating at a destination device (see FIGS. 5A-6B, 13, and corresponding text for further details).

Figure 4:
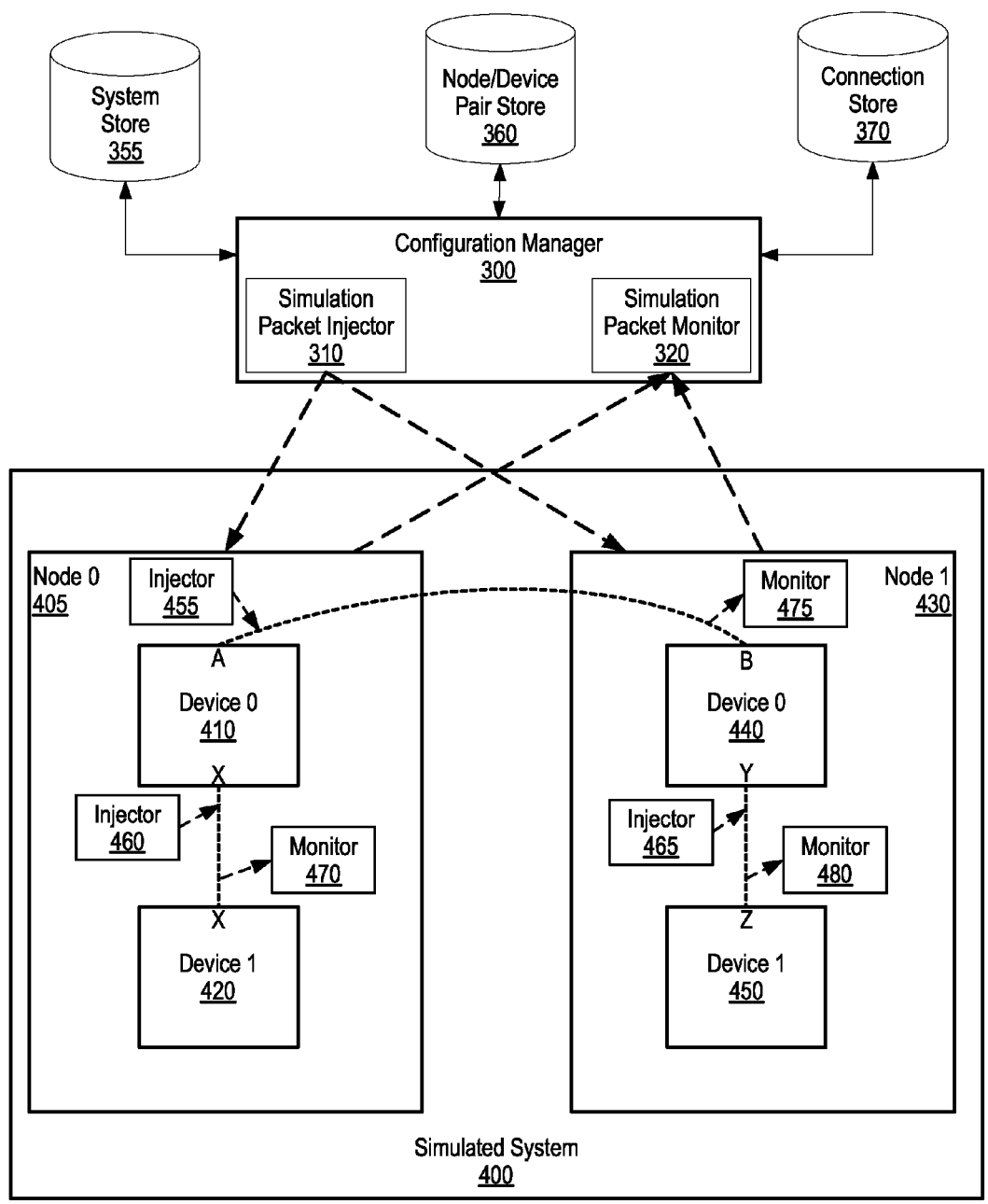
FIG. 4 is an exemplary diagram of a configuration manager performing a direct connection discovery process on a simulated system that includes multiple devices within nodes.

FIG. 4 is a diagram of a configuration manager performing a direct connection discovery process on a simulated system that includes multiple devices within nodes. FIG. 4 is similar to FIG. 3 with the exception that simulated system 400 includes two devices per each node. As can be seen, node 0 405 includes device 0 410 and device 1 420, and node 1 430 includes device 0 440 and device 1 450).

Configuration manager 300 retrieves system information from system store 355 and identifies simulated system 400's device inbound and outbound ports. In turn, simulation only packet injector 310 injects simulation only packets at injectors 455, 460, and 465. Simulation only packet monitor 320 monitors inbound ports at monitor 470, 475, and 480. As discussed above, each port includes an outbound driver and an inbound receiver and, therefore, during configuration manager 300's packet discovery process, the injectors/monitors shown in FIG. 4's example will switch. Meaning, the ports that are originally specified as an outbound port will then become specified as an inbound port.

As simulation only packet monitor 320 detects packets, configuration manager 300 extracts node/device pair information from the simulation only packets and stores the node/device pair information in node/device pair store 360. In addition, configuration manager 300 creates connection entries in connection store 370 that identify direct connections between devices. Once configuration manager 300 completes the direct connection discovery process, configuration manager 300 identifies indirect connections between devices (see FIGS. 5A-6B and corresponding text for further details).

Figure 5A:
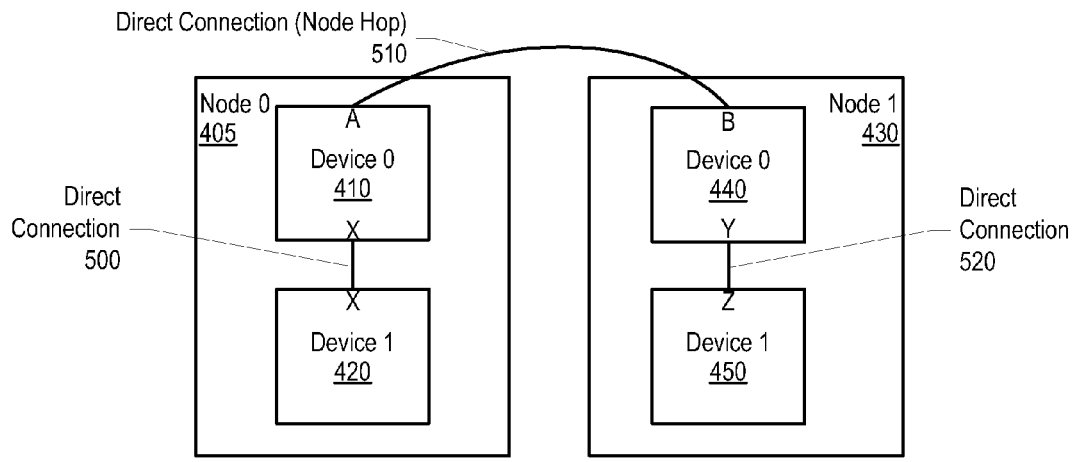
FIG. 5A is an exemplary diagram showing identified direct connections between devices through a direct connection discovery process.

FIG. 5A is a diagram showing identified direct connections between devices through a direct connection discovery process. After a configuration manager proceeds through the direct connection discovery process, the configuration manager identifies direct connections between devices. The direct connections may be internal to a particular node, or some direct connections may be between nodes (node hop connections).

FIG. 5A shows three direct connections, which are direct connections 500, 510, and 520. Direct connection 500 connects device 0 410 port X to device 1 420 port X. Direct connection 520 connects device 0 440 port Y to device 1 450 port Z. And, direct connection 510, which is a node hop connection, connects device 0 410 port A to device 0 440 port B. As discussed below, the configuration manager also creates indirect connections between devices by linking direct connections. Since each device within a node is directly connected by default, the indirect connections are connections between devices residing in different nodes. As a part of the indirect connection identification process, the configuration manager identifies node hop connections in order to "hop" from the sending node to the destination node. The sending node includes the sending device and the destination node includes the destination device.

Although not shown, each direct connection has an opposite connection. Meaning, direct connection 500 may start at device 1 420 and end at device 0 410, but another direct connection exists that starts at device 0 410 and ends at device 1 420.

Figure 5B:
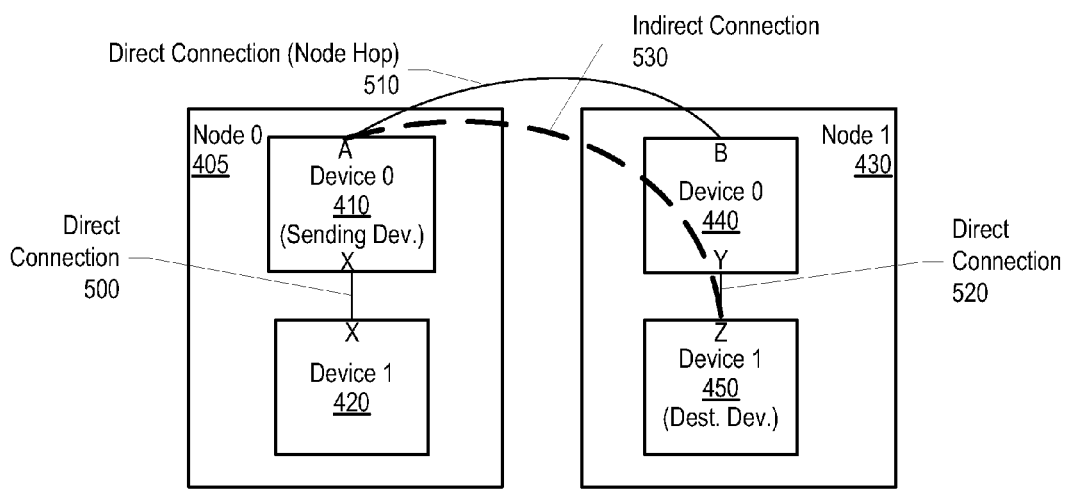
FIG. 5B is an exemplary diagram showing a configuration manager linking various direct connections in order to identify an indirect connection between two non-directly connected devices.

FIG. 5B is a diagram showing a configuration manager linking various direct connections in order to identify an indirect connection between two non-directly connected devices. The example shown in FIG. 5B shows the configuration manager identifying an indirect connection (indirect connection 530) between device 0 410 and device 1 450.

In order to identify the indirect connection, the configuration manager selects device 0 410 as a sending device and selects device 1 450 as a destination device. In turn, the configuration manager creates a connection entry in a connection table and enters the sending device information and the destination device information, which includes a node identifier, a device identifier, and a port identifier (see FIG. 8B, row 854, and corresponding text for further details).

Next, the configuration manager identifies a direct connection (node hop connection) that connects the sending node (node 0 405) to the destination node (node 1 430), which is direct connection 510. The node hop connection initiates from a "node hop initiating device" (device 0 410) and ends at a "node hop recipient device" (device 0 440). Since, in this example, the node hop initiating device is the same as the sending device, the configuration manager includes the node hop connection information into the connection entry as the first "hop."

Next, the configuration manager identifies a direct connection between the node hop recipient device and the destination device, which is direct connection 520. Once identified, the configuration manager includes direct connection 520 information into the entry. The resulting connection entry includes all information required for device 0 410 to send information to device 1 450 through device 0 440.

Figure 6A:
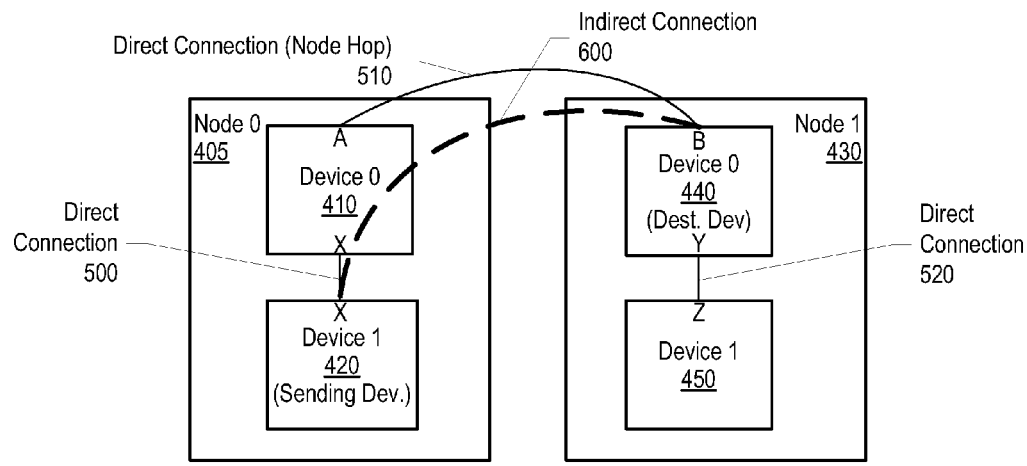
FIGS. 6A and 6B are exemplary diagrams showing a configuration manager linking various direct connections in order to identify indirect connections between devices.

FIG. 6A is a diagram showing a configuration manager linking various direct connections in order to identify an indirect connection between device 1 420 and device 0 440. In order to identify the indirect connection, the configuration manager selects device 1 420 as a sending device and selects device 0 440 as a destination device. In turn, the configuration manager creates a connection entry in a connection table and enters the sending device information and the destination device information, which includes a node identifier, a device identifier, and a port identifier.

Next, the configuration manager identifies a direct connection that connects the sending node (node 0 405) to the destination node (node 1 430), which is direct connection 510. As discussed above in FIG. 5B, the node hop connection initiates from a "node hop initiating device" (device 0 410) and ends at a "node hop recipient device" (device 0 440). In the example shown in FIG. 6A, the node hop initiating device is not the same as the sending device. As such, the configuration manager identifies an "inter-sending node direct connection" between the sending device (device 1 420) and the node hop initiating device (device 0 410), which is direct connection 500. Direct connection 500 is the first connection towards establishing indirect connection 600. As such, the configuration manager enters direct connection 500 information into the connection entry.

Next, the configuration manager enters the node hop connection information (direct connection 510) into the connection entry. Since, in this example, the node hop recipient device is the same as the destination device, the connection entry includes all information required for device 1 420 to send information to device 0 440 through device 0 410.

Figure 6B:
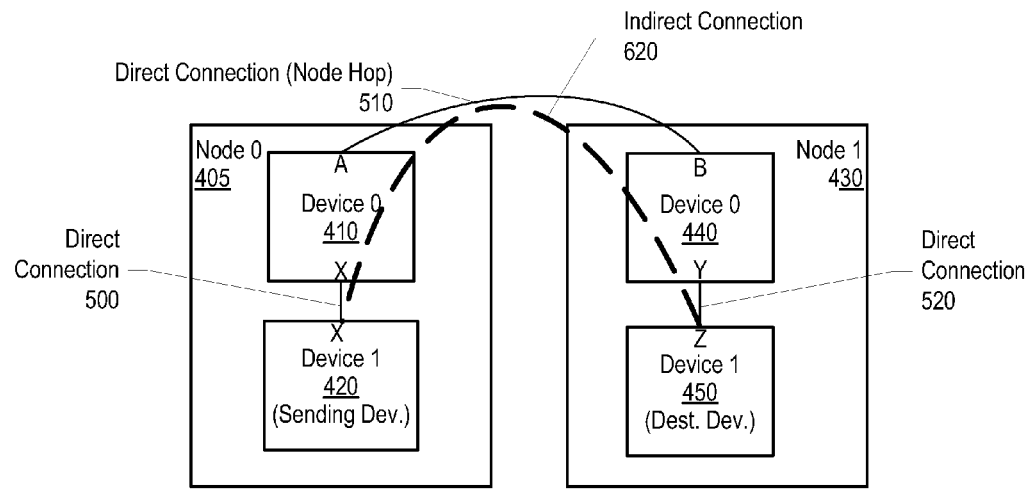

FIG. 6B is a diagram showing a configuration manager linking various direct connections in order to identify an indirect connection between device 1 420 and device 1 450. In order to create the indirect connection, the configuration manager selects device 1 420 as a sending device and selects device 1 450 as a destination device. In turn, the configuration manager creates a connection entry in a connection table and enters the sending device information and the destination device information, which includes a node identifier, a device identifier, and a port identifier (see FIG. 8B, row 656, and corresponding text for further details).

Next, the configuration manager identifies a direct connection that connects the sending node (node 0 405) to the destination node (node 1 430), which is direct connection 510. As discussed above in FIG. 5B, the node hop connection initiates from a "node hop initiating device" (device 0 410) and ends at a "node hop recipient device" (device 0 440). In the example shown in FIG. 6B, the node hop initiating device is not the same as the sending device. As such, the configuration manager identifies an "inter-sending node direct connection" between the sending device (device 1 420) and the node hop initiating device (device 0 410), which is direct connection 500. In turn, the configuration manager enters direct connection 500 information into the connection entry.

Next, the configuration manager enters the node hop connection information (direct connection 510) into the entry. In this example, the node hop recipient device is not the same as the destination device. As such, the configuration manager identifies an "inter-destination node direct connection" between the node hop recipient device (device 0 440) and the destination device (device 1 450), which is direct connection 520. In turn, the configuration manager enters direct connection 520 information into the connection entry. At this point, the connection entry includes all information required for device 1 420 to send information to device 1 450 through device 0 410 and device 0 440.

Figures 7A, 7B:
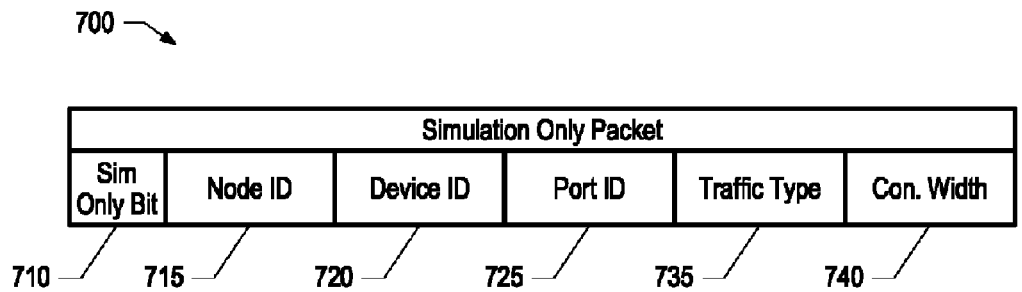
FIG. 7A is an example of a simulation only packet that a configuration manager utilizes in order to identify direct connections between devices.
FIG. 7B is an example of a node/device pair table that a configuration manager populates during a direct connection discovery process.

FIG. 7A is an example of a simulation only packet that a configuration manager utilizes in order to identify direct connections between devices. Simulation only packet 700 includes fields 710-740. Field 710 is a simulation only bit that is valid only for simulation only packets. As such, the configuration manager detects simulation only packets at inbound ports by checking the simulation only bit included in field 710 (see FIG. 11 and corresponding text for further details).

Fields 715-725 include information corresponding to the outbound port in which the configuration manager injects the simulation only packet. For example, if the configuration manager injects the simulation only packet at node 0's device 1's port X, field 715 includes "node 0," field 720 includes "device 1," and field 725 includes "port X." The configuration manager uses this information when it receives a simulation only packet on an inbound port in order to identify the simulation only packet's sending device.

Field 735 includes a traffic type field, which specifies whether the traffic sent from the outbound port will be data only, command only, or data and command. And, field 740 specifies the connection width of the traffic, such as 4-byte, 8-byte, and etcetera.

FIG. 7B is an example of a node/device pair table that a configuration manager populates during a direct connection discovery process. As the configuration manager detects simulation only packets on inbound ports included in simulated system 400 shown in FIG. 4, the configuration manager extracts node and device information from the simulation only packets and enters the information in table 750. As such, table 750 includes information for each device included in simulation system 400. As can be seen, row 760 identifies node 0 405/device 0 410. Row 770 identifies node 0 405/device 1 420. Row 780 identifies node 1 430/device 0 440. And, row 790 identifies node 1 430/device 1 450. The configuration manager uses this information during connection analysis in order to ensure that a connection (direct or indirect) exists between each device (see FIG. 12, 13, and corresponding text for further details).

FIG. 8A is an example of a connection table that a configuration manager populates during a direct connection discovery process. As the configuration manager detects simulation only packets that the configuration manager detects on inbound ports, the configuration manager extracts "sending device" information from the simulation only packet and enters the information in table 800's column 815. As can be seen, row 802 includes an entry for node 0, device 0, port A, which corresponds to FIG. 4's node 0 405, device 0 410, port A.

The configuration manager also identifies the inbound port that received the simulation only packet (destination port) and enters the destination port information in column 820. Continuing with the example above, row 802 includes, as destination port information, node 1, device 0, port B, which corresponds to FIG. 4's node 1 430, device 0 440, port B. Referring to FIG. 4, row 802 corresponds to the simulation only packet that injector 455 sends and monitor 475 detects.

The configuration manager also extracts traffic type information and connection width information from the simulation only packet, and enters the information in columns 825 and 830, respectively (see FIG. 7A and corresponding text for further details).

The configuration manager continues to populate table 800 (rows 804-812) as it detects simulation only packets. As can be seen, two connections exist between each connected port. Meaning, row 802 shows a direct connection from node 0/device 0/port A to node 1/device 0/port B, and row 804 shows a direct connection in the opposite direction (node 1/device 0/port B to node 0/device 0/port A).

Once the configuration manager completes the direct connection discovery process, the configuration manager evaluates table 800 entries and sets aggregate bit values in column 835 for those entries that correspond to matching node/device pairs. For example, if two direct connections exist between node 0/device 0 and node 1/device 1 utilizing different ports on the devices, the configuration manager sets the aggregate bit for each connection entry (see FIG. 12 and corresponding text for further details).

FIG. 8B is an example of a connection table that includes indirect connection entries that a configuration manager enters. Table 840 is an expansion of table 800 shown FIG. 8A, and rows 842 through 852 include the same direct connection information as rows 802 through 812. The configuration manager enters "hop" information in columns 862 through 874, which "link" direct connections together and establish indirect connections. Column 876 includes other connection information such as that shown in FIG. 8A's columns 825-835 discussed above.

After the configuration manager completes the direct connection discovery process, the configuration manager analyzes a node/device pair table, such as table 750 shown in FIG. 7B, in order to determine device pairs that do not have a direct connection. Row 854 includes connection information corresponding to FIG. 5B's indirect connection 530 that indirectly connects device 0 410 to device 1 450. Row 854 includes node 0 405/device 0 410/port A information in sending port column 858 and includes node 1 430/device 1 450/port Z information in destination column 860. Since indirect connection 530 travels through node 1 430/device 0 440, column 862 includes node 1 430/device 0 440/port B information as "Hop 1 In" and column 864 includes node 1 430/device 0 440/port Y information as "Hop 1 Out." The configuration manager also sets a "Hop Valid" bit in column 868 to indicate that the indirect connection includes a hop.

Row 856 includes connection information corresponding to FIG. 6B's indirect connection 620 that indirectly connects device 1 420 to device 1 450. Row 856 includes node 0 405/device 1 420/port X information in column 858, and includes node 1 430/device 1 450/port Z information in column 860. Since indirect connection 620 travels through device 0 410, column 862 includes node 0 405/device 0 410/port X information as "Hop 1 In" and column 864 includes node 0 405/device 0 410/port A information as "Hop 1 Out." In addition, indirect connection 620 travels through device 0 440. As such, column 870 includes node 1 430/device 0 440/port B information as "Hop 2 In," and column 872 includes node 1 430/device 0 440/port Y information as "Hop 2 Out." The configuration manager also sets "Hop Valid" bits in columns 868 and 874 to indicate that the indirect connection includes hops.

Figure 9:
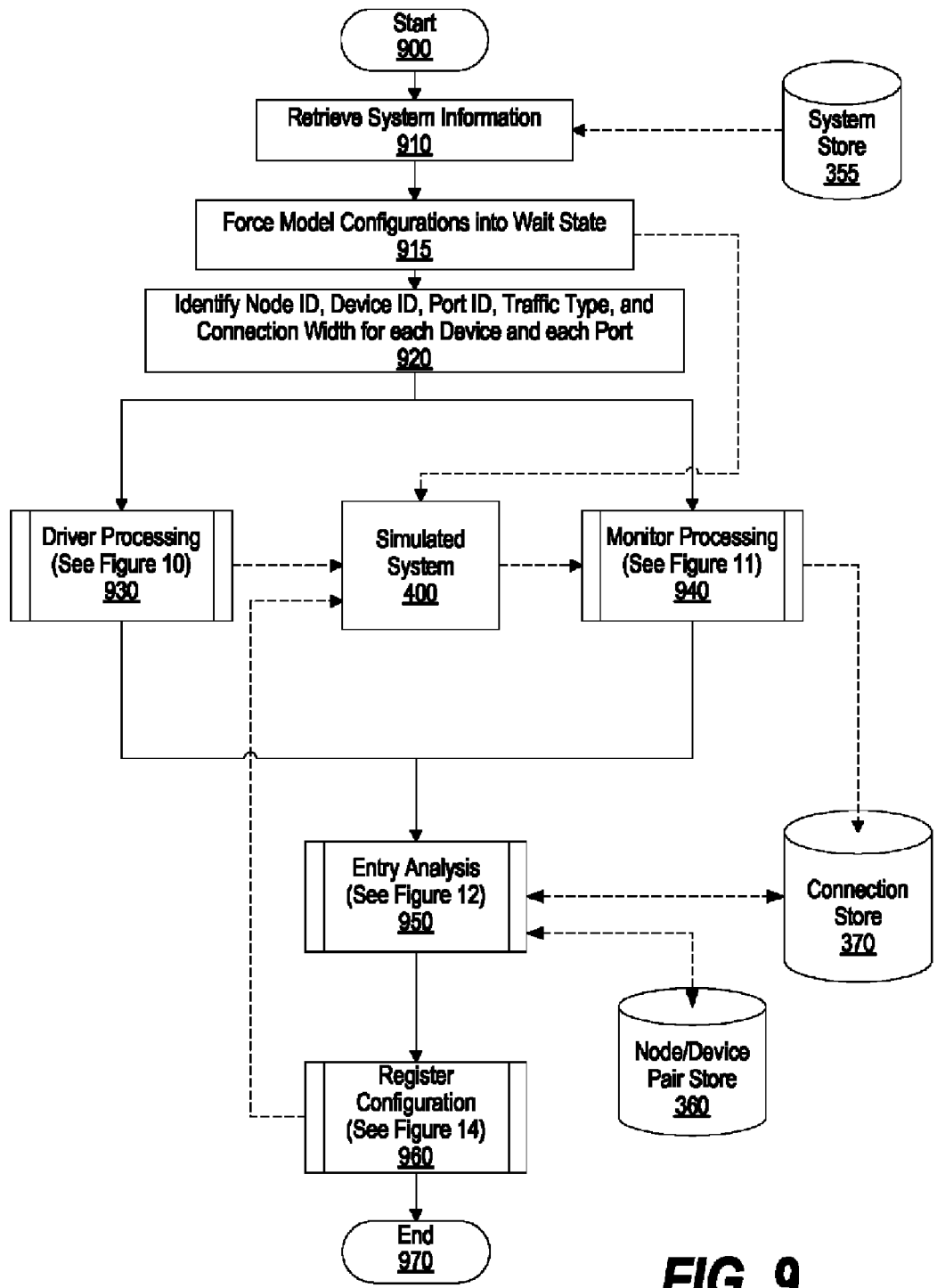
FIG. 9 is an exemplary high-level flowchart showing steps taken a configuration manager proceeding through a direct connection discovery process, identifying indirect connections, and configuring device registers accordingly.

FIG. 9 is a high-level flowchart showing steps taken a configuration manager proceeding through a direct connection discovery process, identifying indirect connections, and configuring device registers accordingly. Configuration management processing commences at 900, whereupon a configuration manager retrieves system information from system store 355 (step 910). The system information includes node identifier/device identifier/port identifier information and the number of devices included in a system.

At step 915, the configuration manager forces the model configurations included in simulated system 400 into a wait state. The configuration manager utilizes the system information to identify node identifiers, device identifiers, port identifiers, traffic types and connection widths for each of simulated system 400's devices.

Figure 10:
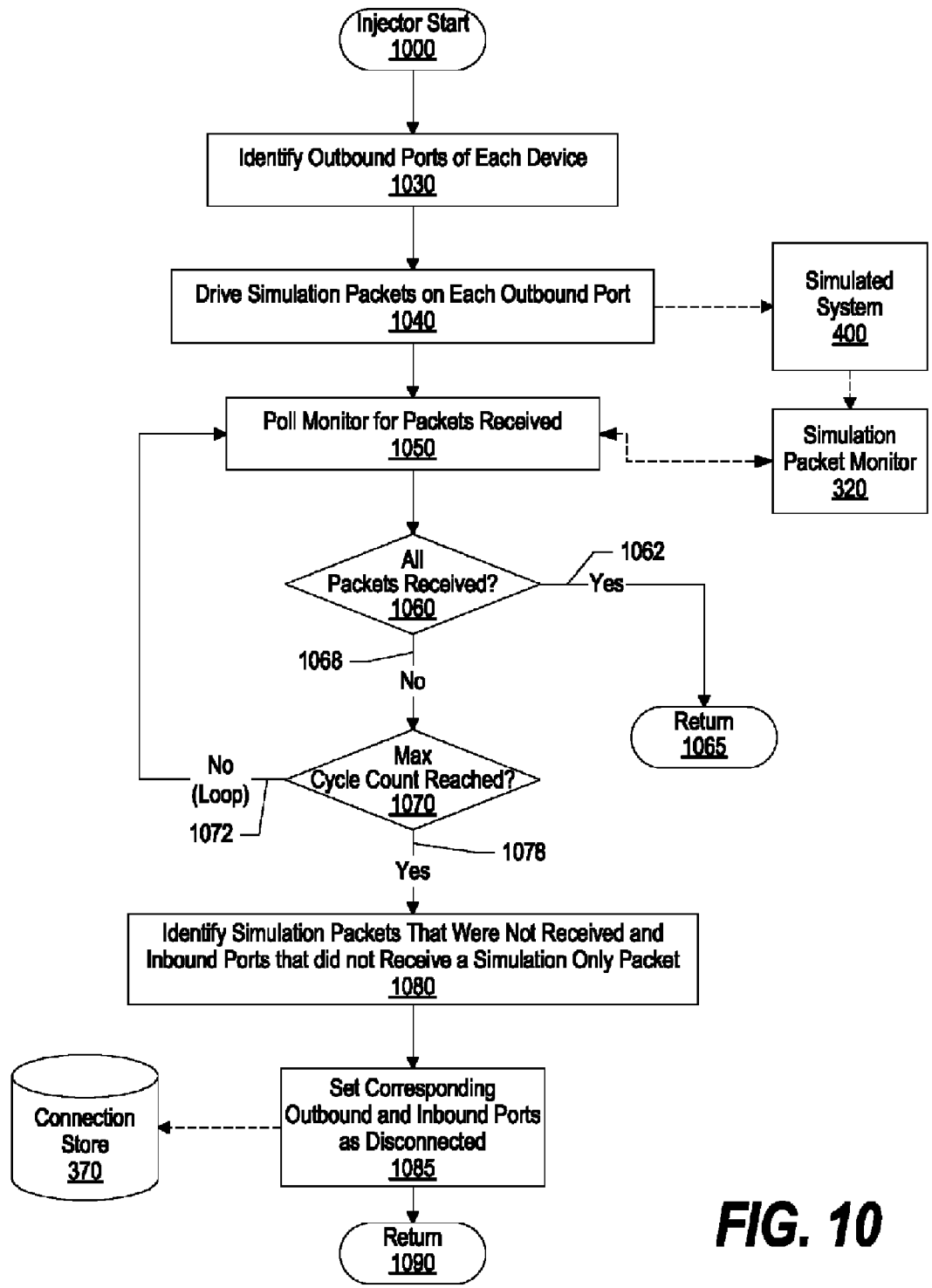
FIG. 10 is an exemplary flowchart showing steps taken in a configuration manager injecting simulation only packets onto a simulated system's device outbound ports.
Figure 11:
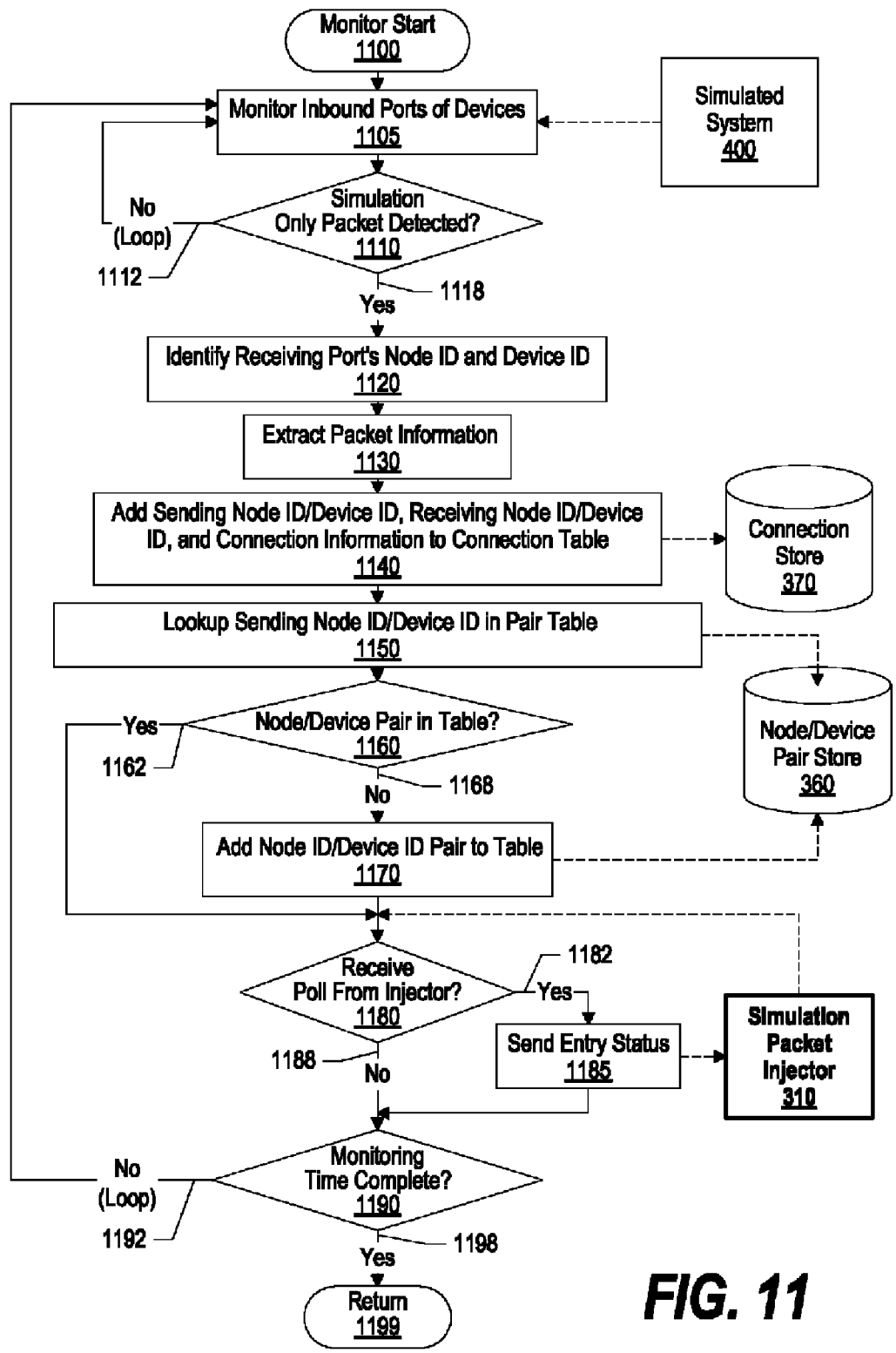
FIG. 11 is an exemplary flowchart showing steps taken in a configuration manager's simulation only packet monitor detecting and logging received simulation only packets.

The configuration manager then invokes a direct connection discovery process by injecting simulation only packets onto each device's outbound ports included in system 400 and monitoring each device's inbound ports for the simulation only packets (pre-defined process blocks 920 930 and 940, see FIGS. 10 and 11, respectively, and corresponding text for further details). During the configuration manager's monitoring process, the configuration manager creates direct connection entries in connection store 370. The configuration manager creates a direct connection entry when the configuration manager receives a simulation only packet and identifies the sending location (node/device/port) and the destination location (node/device/port).

Figure 12:
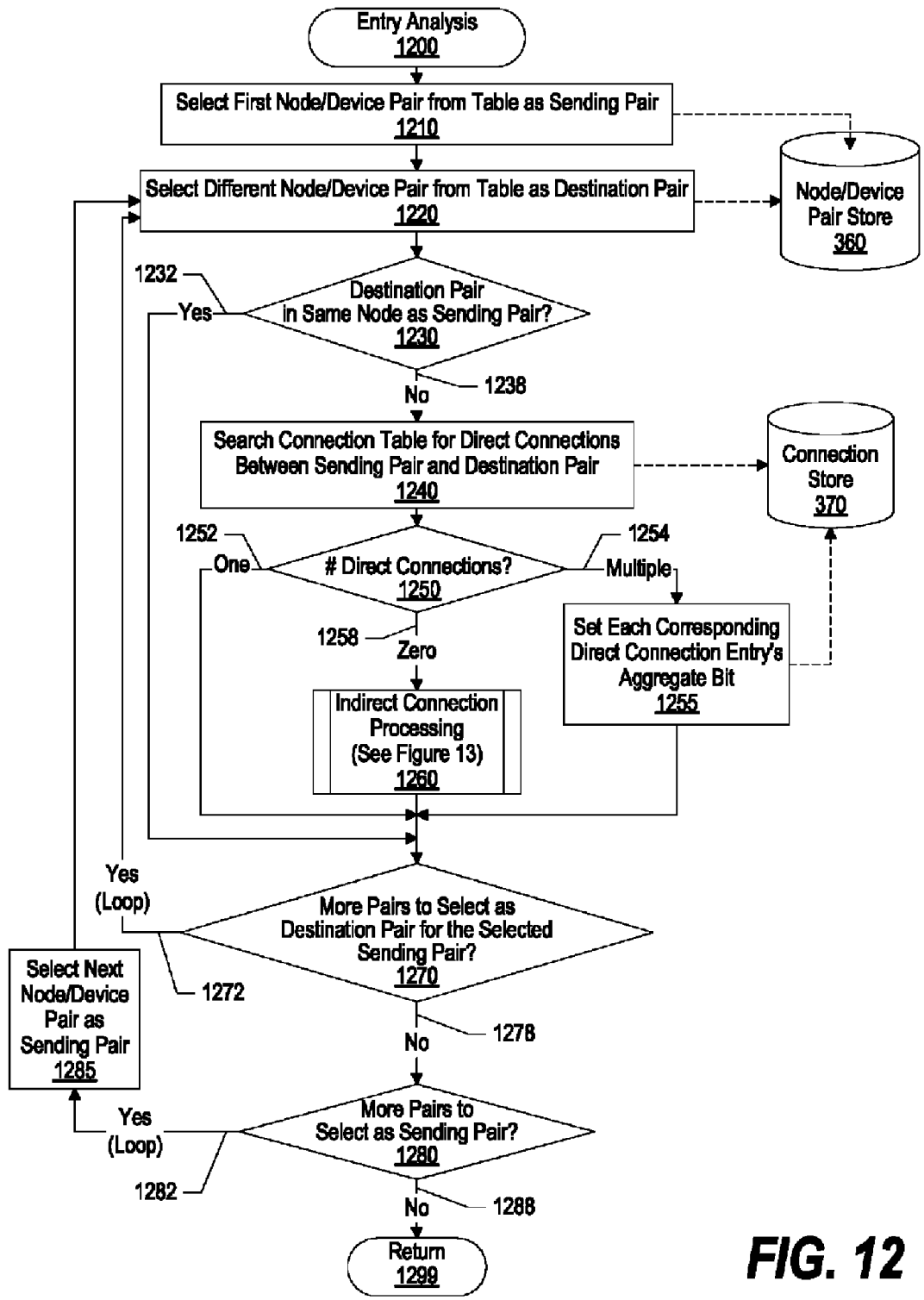
FIG. 12 is an exemplary flowchart showing steps taken a configuration manager analyzing information received during a direct connection discovery process and identifying direct connections and indirect connections between devices.

Once the configuration manager completes the direct connection discovery process, the configuration manager analyzes the connection entries that are stored in connection store 370 (pre-defined process block 950, see FIG. 12 and corresponding text for further details). During the analysis, the configuration manager stores node/device pairs in node/device pair store 360 and identifies direct connections between devices as well as indirect connections between devices. For example, a direct connection may exist between a first device and a second device, and an indirect connection may exist between the first device and a third device, which passes through the second device.

In one embodiment, a user may pre-define a list of rules and, if any of the rules are broken during the process of identifying direct connections and indirect connections, the configuration manager flags the broken rules and stops the procedure. For example, a user may define rules such as 1) every device must have a path to another device, 2) links are connected in pairs, such that driver/receiver of each port are both connected to the driver/receiver of the other port, and 3) only one command port is active between devices.

Figure 14:
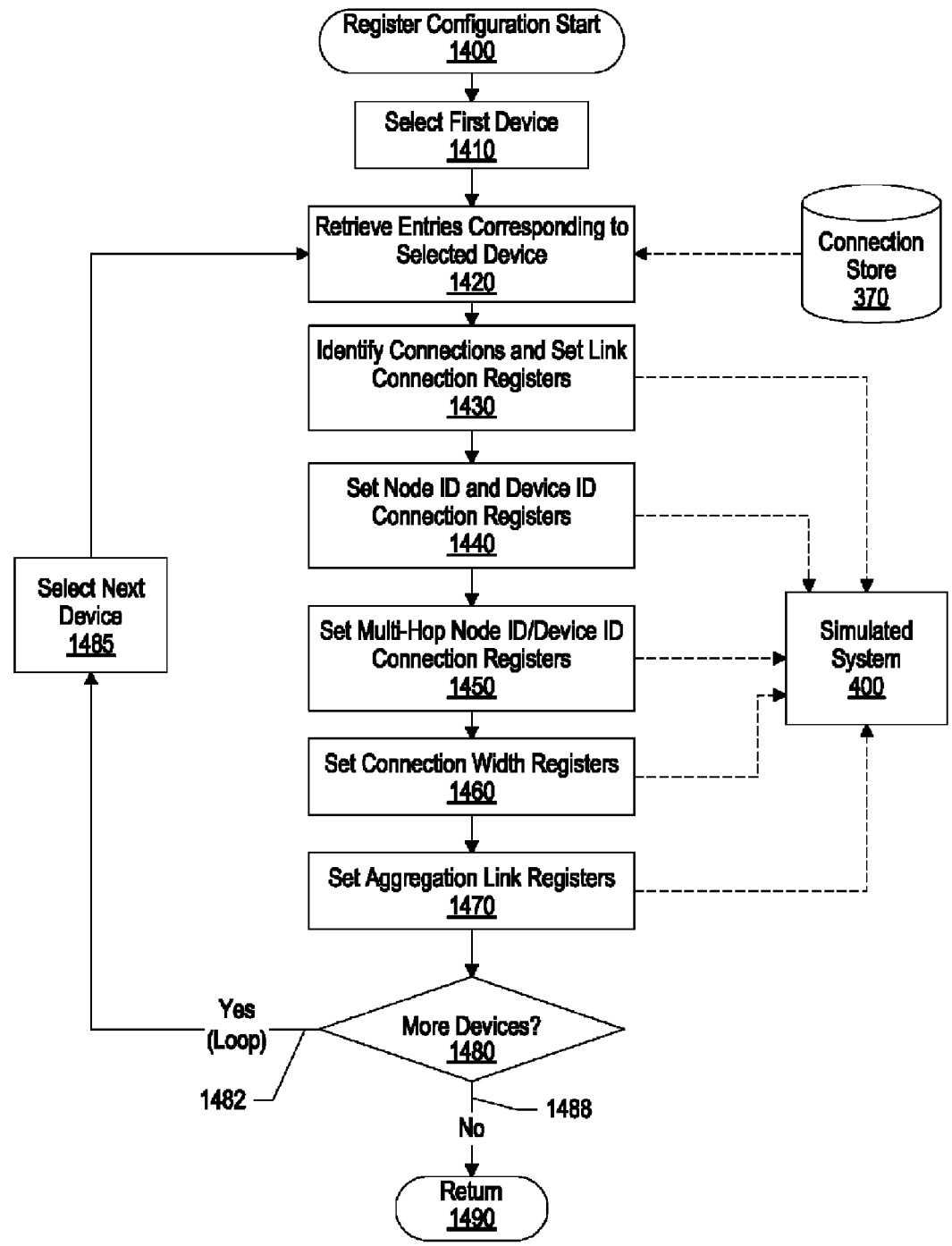
FIG. 14 is an exemplary flowchart showing steps taken in a configuration manager configuring registers after identifying direct connections.

Once the configuration identifies the direct and indirect connections between the devices, the configuration manager sets configuration registers that correspond to the different devices accordingly (pre-defined process block 960, see FIG. 14 and corresponding text for further details). Processing ends at 970.

In one embodiment, a simulation reference model uses the identified connection information to predict expected simulation results. For example, once the configuration manager configures the registers and a real simulation commences, the simulation monitor program uses the collected information to predict a manner in which data should transfer from one device to the next. If the simulation monitor program detects data being routed along a path that does not correspond to the expected routing path, the simulation monitor program flags an error and fails the simulation.

FIG. 10 is a flowchart showing steps taken in a configuration manager injecting simulation only packets onto a simulated system's device outbound ports. Configuration manager injector processing commences at 1000, whereupon the configuration manager utilizes retrieved system information to identify devices' outbound ports (step 1030) and begins injecting simulation only packets onto each of simulation system 400's outbound ports (step 1040). The simulation only packets have a set simulation only bit, which identifies the packets as a simulation only packet (see FIG. 7A and corresponding text for further details).

At step 1050, the configuration manager polls simulation only packet monitor 320 to check which simulation only packets have been received. Simulation only packet monitor 320 monitors each device's inbound ports for the simulation only packets while they are injected onto each device's outbound ports. The configuration manager determines whether simulation only packet monitor 320 received each of the simulation only packets (decision 1060). If simulation only packet monitor 320 received all off the simulation only packets, the configuration manager branches to "Yes" branch 1062 whereupon processing returns at 1065. On the other hand, if simulation only packet monitor 320 has not received all of the simulation only packets, the configuration manager branches to "No" branch 1068, whereupon a the configuration manager determines whether a maximum cycle count is reached (e.g., whether monitoring time has expired) (decision 1070).

If time has not expired, the configuration manager branches to "No" branch 1072, which loops back to continue to poll simulation only packet monitor 320. This looping continues until the maximum cycle count is reached, at which point the configuration manager branches to "Yes" branch 1078.

At step 1080, the configuration manager identifies simulation only packets that were not received by any inbound port, and also identifies inbound ports that did not receive a simulation only packet. At step 1085, the configuration manager sets the corresponding inbound ports and outbound as disconnected in connection store 370. For example, the configuration manager may inject a simulation only packet onto device A's outbound port 2 and, in this example, simulation only packet monitor does not detect the particular simulation only packet on any inbound port. In this example, the configuration manager determines that device A's outbound port 2 is not connected to another device included in the system. Processing returns at 1090.

FIG. 11 is a flowchart showing steps taken in a configuration manager's simulation only packet monitor detecting and logging received simulation only packets. Processing commences at 1100, whereupon the configuration manager monitors simulated system 400's device inbound ports (step 1105). When the simulation only packet monitor detects a packet, the configuration manager determines whether the packet is a simulation only packet by checking a bit included in the packet that specifically identifies simulation only packets (decision 1110). If the received packet is not a simulation only packet, the configuration manager (branch 1112) continues to monitor device inbound ports. This looping continues until the configuration manager receives a simulation only packet, at which point the configuration manager branches to "Yes" branch 1118.

At step 1120, the configuration manager identifies the receiving port's node identifier, device identifier, and port identifier (e.g., node 0, device 1, port 2). The configuration manager then extracts information from the simulation only packet at step 1130, which includes information pertaining to the outbound port that sent the packet (sending node ID, device ID, port ID, etc.).

The configuration manager, at step 1140, creates an entry in a connection table included in connection store 370 that includes information pertaining to the port that sent the simulation only packet (node ID, device ID, port ID) and the port that received the simulation only packet (node ID, device ID, port ID).

In order to track the node/device pairs that reside within simulated system 400, the configuration manager looks-up the sending node identifier/device identifier pair in node/device pair store 360 at step 1150. The configuration manager determines whether the pair is currently logged in the pair table (decision 1160). If the pair is not currently logged, the configuration manager branches to "No" branch 1168, whereupon the configuration manager adds the node/device pair in node/device pair store 360. On the other hand, if the pair already exists within the table, the configuration manager branches to "Yes" branch 1162, bypassing step 1170.

The configuration manager determines whether simulation only packet injector 310 requests status information from the simulation only packet monitor (decision 1180). Simulation only packet injector 310 periodically sends polling requests in order to determine whether the simulation only packet monitor has detected each simulation only packet. If simulation only packet injector 310 sent a polling request, the configuration manager branches to "Yes" branch 1182, whereupon the configuration manager sends status information to simulation only packet injector 310 that identifies simulation only packets that the simulation only packet monitor received. On the other hand, if simulation packet injector 310 did not send a polling request, the configuration manager branches to "No" branch 1188, bypassing step 1185.

The configuration manager determines whether the monitoring time has expired (decision 1190). If the monitoring time has not expired, the configuration manager branches to "No" branch 1192, which loops back and continues to monitor inbound ports for simulation only packets. This looping continues until the monitoring time has expired, at which point the configuration manager branches to "Yes" branch 1198, whereupon processing returns at 1199.

FIG. 12 is a flowchart showing steps taken a configuration manager analyzing information received during a direct connection discovery process and identifying direct connections and indirect connections between devices. Configuration management processing commences at 1200, whereupon the configuration manager selects a first node/device pair from a node/device table as a "sending pair" at step 1210. At step 1220, the configuration manager selects a different node/device pair from the node/device table as a "destination pair." The node/device table is stored in node/device pair store 360 and includes node/device pair combinations that the configuration manager identified during the direct connection discovery process (see FIG. 7B and corresponding text for further details).

The configuration manager determines whether the destination pair is within the same node as the sending pair (decision 1230). Devices within the same node are directly connected with each other and, therefore, the configuration manager already entered a direct connection entry in a connection table stored in connection store 370 during the direct connection discovery process (see FIG. 8A and corresponding text for further details). For example, a node 0/device 1 sending pair resides in the same node as a node 0/device 2 destination pair. If the destination pair is within the same node as the sending pair, the configuration manager branches to "Yes" branch 1232, bypassing connection determination steps.

On the other hand, if the destination pair is not within the same node as the sending pair, the configuration manager branches to "No" branch 1238. At step 1240, the configuration manager searches the connection table included in connection store 370 for direct connections between the sending pair and the destination pair. For example, although in different nodes, node 0/device 1 may be directly connected to node 1/device 0.

The configuration manager determines the number of identified direct connections (decision 1250). If there are multiple direct connections, the configuration manager branches to "Multiple" branch 1254 whereupon the configuration manager sets an aggregate bit for each identified direct connection entry. For example, if node 0/device 1 connects to node 1/device 0 through three different ports, the configuration manager sets the aggregate bit for each of the three different entries. The aggregate bit is used to 1) program any associated registers in the hardware that are related to aggregate links and 2) used by a simulation reference model program to build expected results (which data path will be used) for data transfers. On the other hand, if the configuration manager identifies one direct connection, the configuration manager branches to "One" branch 1252, bypassing steps 1255 or 1260.

Yet on the other hand, if the configuration manager does not identify any direct connections between the sending pair and the destination pair, the configuration manager branches to "Zero" branch 1258, whereupon the configuration manager proceeds through a series of steps to identify an indirect connection between the sending pair and the destination pair (pre-defined process block 1260, see FIG. 11 and corresponding text for further details).

The configuration manager determines whether there are more node/device pairs in which to select as a destination pair for the selected sending pair (decision 1270). If there are more pairs to select as a destination pair, the configuration manager branches to "Yes" branch 1272, which loops back to select a different pair and identify direct/indirect connections between the sending pair and the newly selected destination pair. This looping continues until the configuration manager associates the selected sending pair to each of the other node/device pairs, at which point the configuration manager branches to "No" branch 1278.

The configuration manager determines whether there are more pairs in which to select as a sending pair (e.g., the second entry in the pair table). If there are more pairs in which to select as a sending pair, the configuration manager branches to "Yes" branch 1282, which loops back to select (step 1285) and process the next pair as a sending pair. This looping continues until each pair is selected as a sending pair, at which point the configuration manager branches to "No" branch 1288, whereupon processing returns at 1299.

Figure 13:
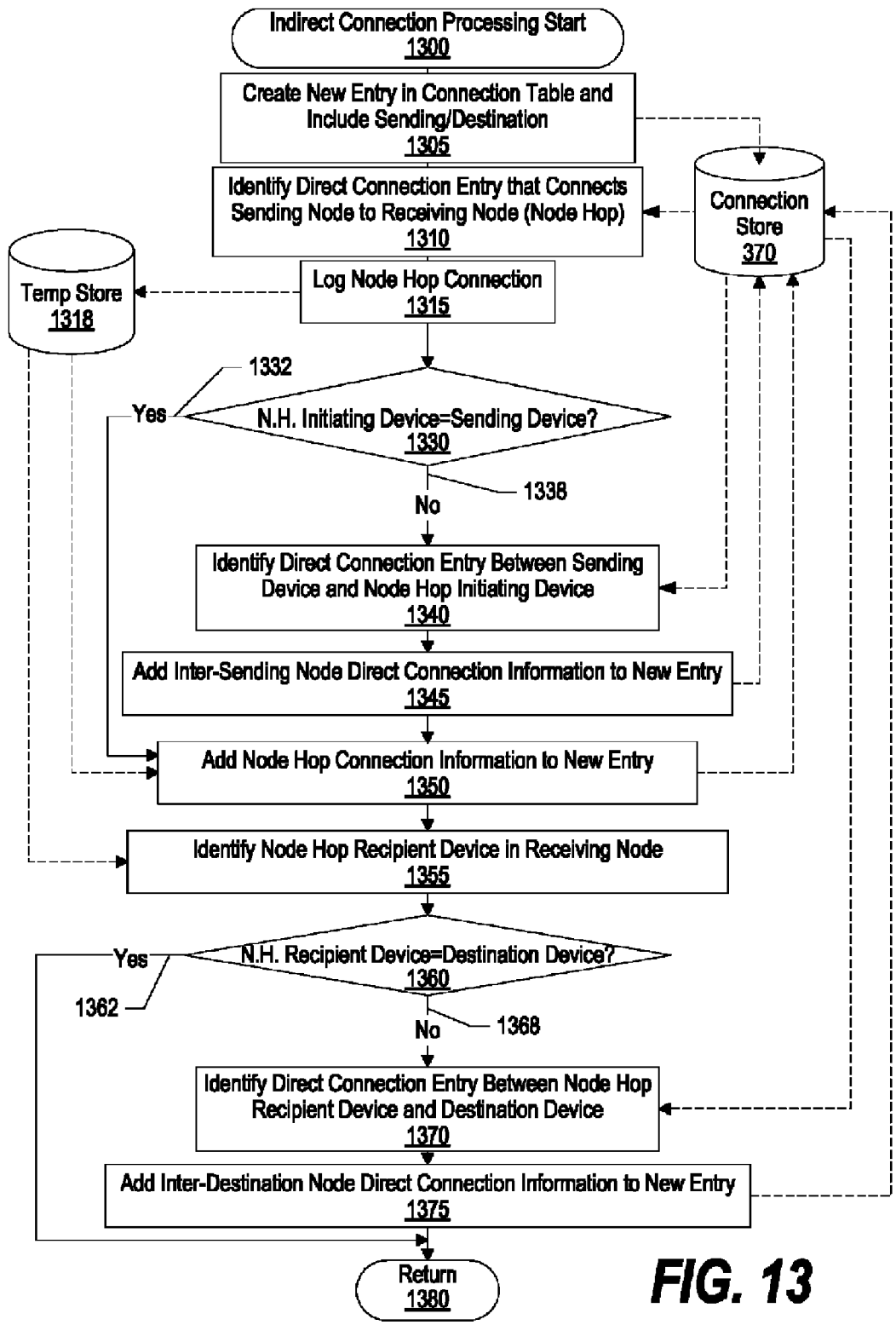
FIG. 13 is an exemplary flowchart showing steps taken a configuration manager identifying indirect connections between devices.

FIG. 13 is a flowchart showing steps taken a configuration manager identifying indirect connections between devices. Indirect connections are connections between devices that pass through other devices. For example, if device 1 is directly connected to device 2, which is directly connected to device 3, device 1 is indirectly connected to device 3 through device 2.

Processing commences at 1300, whereupon the configuration manager creates a new entry in a connection table (located in connection store 370), and includes sending node/device/port information and destination node/device/port information (step 1305). Referring to FIG. 8B, the configuration manager creates a new entry (row 854) and includes sending information (column 858) and destination information (column 860) in the new entry.

Next, the configuration manager identifies a direct connection that connects the sending node to the destination node (step 1310). For example, the sending device may be included in node 0 and the destination device may be included in node 1. In this example, the configuration manager identifies a direct connection between a device included in node 0 (node hop initiating device) and another device included in node 1 (node hop recipient device). The configuration manager logs the node hop connection in temporary store 1318 at step 1315 for later retrieval (see below).

The configuration manager determines whether the node hop initiating device is the same as the sending device (decision 1330). In other words, the configuration manager determines whether the sending device has a direct connection to a device that is located in the destination node.

If the sending device has a direct connection to a device in the destination node, the configuration manager branches to "Yes" branch 1332 bypassing steps 1340-1345 and adds the node hop connection information in the new entry (step 1350). On the other hand, if the node hop initiating device is not the same as the sending device, the configuration manager branches to "No" branch 1338, whereupon the configuration manager identifies a direct connection between the sending device and the node hop initiating device (step 1340). Referring to FIG. 6B, the configuration manager identifies device 0 410 as the node hop initiating device, and identifies direct connection 500 as the direct connection between the sending device (device 1 420) and device 0 410.

The configuration manager then adds "inter-sending node direct connection" information to the new entry at step 1345, which corresponds to the direct connection between the sending device and the node hop initiating device. Referring to FIG. 8B, row 856, the configuration manager populates column 862 with port information that connects the sending device to the node hop initiating device.

Next, the configuration manager adds node hop connection information to the entry at step 1350. Referring to FIG. 8B, row 856, the configuration manager populates column 864 with the node hop initiating port information and populates column 870 with the node hop recipient port information.

At this point, the entry includes information to connect the sending device over to the destination node. Next, the configuration manager identifies the node hop recipient device in the destination node (step 1355). The configuration manager determines whether the node hop recipient device is the same as the destination device (decision 1360). If the node hop recipient device is the same as the destination device, the configuration manager branches to "Yes" branch 1362 bypassing steps 1370 and 1375 because the indirect connection entry is complete. On the other hand, if the node hop recipient device is not the same as the destination device, the configuration manager branches to "No" branch 1368.

At step 1370, the configuration manager identifies a direct connection entry that connects the node hop recipient device with the destination device. Referring to FIG. 6B, device 1 450 is the destination device and device 0 440 is the node hop recipient device. In the example shown in FIG. 6B, the configuration manager identifies direct connection 520 as the direct connection entry that connects the node hop recipient device with the destination device. The configuration manager adds the inter-destination node direct connection information to the new entry at step 1375. Referring to FIG. 8B, row 856, the configuration manager populates column 872 with port information that connects the node hop recipient device to the destination device. Processing returns at 1380.

FIG. 14 is a flowchart showing steps taken in a configuration manager configuring registers after identifying direct connections and indirect connections that are based upon a direct connection discovery process. Processing commences at 1400, whereupon the configuration manager selects a first device at step 1410. At step 1420, the configuration manager retrieves connection entries that correspond to the selected device from connection store 370. Next, the configuration manager uses the connection entries to identify connections between devices and sets the selected device's link connection registers accordingly (step 1430). The configuration manager proceeds to set node identifier/device identifier connection registers for the selected device (step 1440), as well as sets multi-hop connection registers if the connection is an indirect connection (step 1450). The configuration manager then sets the device's link width registers at step 1460 as well as sets the device's aggregation link registers if applicable (step 1470).

The configuration manager determines whether there are more devices to select and configure (decision 1480). If there are more devices to configure, the configuration manager branches to "Yes" branch 1482, which loops back to select (step 1485) and configure the next device. This looping continues until there are no more devices in which to configure, at which point the configuration manager branches to "No" branch 1488 whereupon processing returns at 1490.

One of the preferred implementations of the invention is a client application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive). Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information that imparts functionality to a machine. Functional descriptive material includes, but is not limited to, computer programs, instructions, rules, facts, definitions of computable functions, objects, and data structures.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A machine-implemented method comprising:
    identifying, by a configuration manager executing on one or more processors, a first device and a second device within a simulated system, wherein each of the devices within the simulated system includes an inbound port and an outbound port, and wherein the configuration manager is separate from the first device and the second device;
    injecting, by the configuration manager, a first simulation only packet on the first device's outbound port, the first simulation only packet including information that identifies the first device's outbound port;
    detecting, by the configuration manager, the first simulation only packet on the second device's inbound port;
    in response to the detecting, identifying, by the configuration manager, a first direct connection between the first device's outbound port and the second device's inbound port; and
    in response to identifying the first direct connection, configuring, by the configuration manager, one or more first device configuration registers and configuring one or more second device configuration registers based upon the first direct connection, wherein the one or more first device configuration registers correspond to the first device and the one or more second device configuration registers correspond to the second device.

2. The method of claim 1 wherein the first device and the second device are included in a first node and wherein a third device within the simulated system is included in a second node, the method further comprising:
injecting a second simulation only packet on the second device's outbound port, the second simulation only packet including information that identifies the second device's outbound port;
identifying a second direct connection between the second device and the third device in response to detecting the second simulation only packet on the third device's inbound port;
in response to identifying the second direct connection, identifying an indirect connection between the first device and the third device, the indirect connection including the first direct connection and the second direct connection; and
configuring the one or more first device configuration registers, the one or more second device configuration registers, and one or more third device configuration registers in response to identifying the indirect connection, the one or more third configuration registers corresponding to the third device.

3. The method of claim 2 further comprising:
creating a connection entry that includes sending port information and destination port information, the sending port information identifying the first node, the first device, and the first device's outbound port, and the destination port information identifying the second node, the third device, and the third device's inbound port;
and
adding node hop connection information to the connection entry, the node hop connection information identifying the first node, the second device, the second device's inbound port, and the second device's outbound port.

4. The method of claim 2 wherein a fourth device within the simulated system is included in the second node, the method further comprising:
injecting a third simulation only packet on the third device's outbound port, the third simulation only packet including information that identifies the third device's outbound port;
identifying a third direct connection between the third device and the fourth device in response to detecting the third simulation only packet on the fourth device's inbound port;
identifying a second indirect connection between the first device and the fourth device, the second indirect connection including the first direct connection, the second direct connection, and the third direct connection; and
configuring the direct first device configuration registers, the one or more second device configuration registers, the one or more third device configuration registers, and one or more fourth device configuration registers in response to identifying the second indirect connection, the one or more fourth device configuration registers corresponding to the fourth device.

5. The method of claim 1 further comprising:
receiving a packet on the second device's inbound port;
checking a simulation only bit included in the packet; and
determining that the packet is the first simulation only packet in response to identifying that the simulation only bit is valid.

6. The method of claim 1 wherein the first device resides within a first node and the second device resides within a second node, the method further comprising:
extracting sending port information from the first simulation only packet, wherein the sending port information identifies the first node, the first device, and the first device's outbound port;
identifying destination port information that identifies the second node, the second device, and the second device's inbound port; and
creating a connection entry that includes the sending port information and the destination port information.

7. The method of claim 1 further comprising:
utilizing information for the first direct connection to create an expected simulation result;
invoking a simulation;
comparing results from the invoked simulation with the expect simulation result; and
based upon the comparing, creating an error message based upon the results from the simulation not matching the expected simulation result.

8. A computer program product stored in a non-transitory computer readable medium, comprising functional descriptive material that, when executed by an information handling system, causes the information handling system to perform actions that include:
identifying, by a configuration manager, a first device and a second device within a simulated system, wherein each of the devices within the simulated system includes an inbound port and an outbound port, wherein the configuration manager is separate from the first device and the second device;
injecting a first simulation only packet on the first device's outbound port, the first simulation only packet including information that identifies the first device's outbound port;
detecting the first simulation only packet on the second device's inbound port;
in response to the detecting, identifying a first direct connection between the first device's outbound port and the second device's inbound port; and
in response to identifying the first direct connection, configuring one or more first device configuration registers and configuring one or more second device configuration registers based upon the first direct connection, wherein the one or more first device configuration registers correspond to the first device and the one or more second device configuration registers correspond to the second device.

9. The computer program product of claim 8 wherein the first device and the second device are included in a first node and wherein a third device within the simulated system is included in a second node, the information handling system further performing actions that include:
injecting a second simulation only packet on the second device's outbound port, the second simulation only packet including information that identifies the second device's outbound port;
identifying a second direct connection between the second device and the third device in response to detecting the second simulation only packet on the third device's inbound port;
in response to identifying the second direct connection, identifying an indirect connection between the first device and the third device, the indirect connection including the first direct connection and the second direct connection; and configuring the one or more first device configuration registers, the one or more second device configuration registers, and one or more third device configuration registers in response to identifying the indirect connection, the one or more third configuration registers corresponding to the third device.

10. The computer program product of claim 9 wherein the information handling system further performs actions that include:

creating a connection entry that includes sending port information and destination port information, the sending port information identifying the first node, the first device, and the first device's outbound port, and the destination port information identifying the second node, the third device, and the third device's inbound port; and adding node hop connection information to the connection entry, the node hop connection information identifying the first node, the second device, the second device's inbound port, and the second device's outbound port.

11. The computer program product of claim 9 wherein a fourth device within the simulated system is included in the second node, the information handling system further performing actions that include:

injecting a third simulation only packet on the third device's outbound port, the third simulation only packet including information that identifies the third device's outbound port;

identifying a third direct connection between the third device and the fourth device in response to detecting the third simulation only packet on the fourth device's inbound port;

identifying a second indirect connection between the first device and the fourth device, the second indirect connection including the first direct connection, the second direct connection, and the third direct connection; and configuring the one or more first device configuration registers, the one or more second device configuration registers, the one or more third device configuration registers, and one or more fourth device configuration registers in response to identifying the second indirect connection, the one or more fourth device configuration registers corresponding to the fourth device.

12. The computer program product of claim 8 wherein the information handling system further performs actions that include:

receiving a packet on the second device's inbound port;
checking a simulation only bit included in the packet; and
determining that the packet is the first simulation only packet in response to identifying that the simulation only bit is valid.

13. The computer program product of claim 8 wherein the first device resides within a first node and the second device resides within a second node, the information handling system further performing actions that include:

extracting sending port information from the first simulation only packet, wherein the sending port information identifies the first node, the first device, and the first device's outbound port;

identifying destination port information that identifies the second node, the second device, and the second device's inbound port; and creating a connection entry that includes the sending port information and the destination port information.

14. The computer program product of claim 8 wherein the information handling system further performs actions that include:

utilizing information for the first direct connection to create an expected simulation result;

invoking a simulation;

comparing results from the invoked simulation with the expect simulation result; and based upon the comparing, creating an error message based upon the results from the simulation not matching the expected simulation result.

15. An information handling system comprising:
one or more processors;
a memory coupled to at least one of the processors;
a nonvolatile storage area coupled to the at least one of the processors;
a set of instructions stored in the memory and executed by the at least one of the processors in order to perform actions of:

identifying, by a configuration manager, a first device and a second device within a simulated system, wherein each of the devices within the simulated system includes an inbound port and an outbound port, and wherein the configuration manager is separate from the first device and the second device;

injecting a first simulation only packet on the first device's outbound port, the first simulation only packet including information that identifies the first device's outbound port;

detecting the first simulation only packet on the second device's inbound port;

in response to the detecting, identifying a first direct connection between the first device's outbound port and the second device's inbound port; and in response to identifying the first direct connection, configuring one or more first device configuration registers and configuring one or more second device configuration registers based upon the first direct connection, wherein the one or more first device configuration registers correspond to the first device and the one or more second device configuration registers correspond to the second device.

16. The information handling system of claim 15 wherein the first device and the second device are included in a first node and wherein a third device within the simulated system is included in a second node, the information handling system further performing actions that include:

injecting a second simulation only packet on the second device's outbound port, the second simulation only packet including information that identifies the second device's outbound port;

identifying a second direct connection between the second device and the third device in response to detecting the second simulation only packet on the third device's inbound port;

in response to identifying the second direct connection, identifying an indirect connection between the first device and the third device, the indirect connection including the first direct connection and the second direct connection; and configuring the one or more first device configuration registers, the one or more second device configuration registers, and one or more third device configuration registers in response to identifying the indirect connection, the one or more third configuration registers corresponding to the third device.

17. The information handling system of claim 16 wherein the information handling system further performs actions that include:
creating a connection entry that includes sending port information and destination port information, the sending port information identifying the first node, the first device, and the first device's outbound port, and the destination port information identifying the second node, the third device, and the third device's inbound port;
and
adding node hop connection information to the connection entry, the node hop connection information identifying the first node, the second device, the second device's inbound port, and the second device's outbound port.

18. The information handling system of claim 16 wherein a fourth device within the simulated system is included in the second node, the information handling system further performing actions that include:
injecting a third simulation only packet on the third device's outbound port the third simulation only packet including information that identifies the third device's outbound port;
identifying a third direct connection between the third device and the fourth device in response to detecting the third simulation only packet on the fourth device's inbound port;
identifying a second indirect connection between the first device and the fourth device, the second indirect connection including the first direct connection, the second direct connection, and the third direct connection; and
configuring the one or more first device configuration registers, the one or more second device configuration registers, the one or more third device configuration registers, and one or more fourth device configuration registers in response to identifying the second indirect connection, the one or more fourth device configuration registers corresponding to the fourth device.

19. The information handling system of claim 15 wherein the information handling system further performs actions that include:
receiving a packet on the second device's inbound port;
checking a simulation only bit included in the packet; and
determining that the packet is the first simulation only packet in response to identifying that the simulation only bit is valid.

20. The information handling system of claim 15 wherein the first device resides within a first node and the second device resides within a second node, the information handling system further performing actions that include:
extracting sending port information from the first simulation only packet, wherein the sending port information identifies the first node, the first device, and the first device's outbound port;
identifying destination port information that identifies the second node, the second device, and the second device's inbound port; and
creating a connection entry that includes the sending port information and the destination port information.

\* \* \* \* \*